(12) United States Patent
Cheng et al.

(10) Patent No.: US 9,997,421 B2
(45) Date of Patent: Jun. 12, 2018

(54) TOP CONTACT RESISTANCE MEASUREMENT IN VERTICAL FETS

(71) Applicant: INTERNATIONAL BUSINESS MACHINES CORPORATION, Armonk, NY (US)

(72) Inventors: Kangguo Cheng, Schenectady, NY (US); Zuoguang Liu, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/498,900

(22) Filed: Apr. 27, 2017

(65) Prior Publication Data

US 2018/0025950 A1 Jan. 25, 2018

Related U.S. Application Data

(62) Division of application No. 15/218,378, filed on Jul. 25, 2016.

(51) Int. Cl.
*H01L 21/66* (2006.01)
*H01L 29/66* (2006.01)
(Continued)

(52) U.S. Cl.
CPC ........ *H01L 22/14* (2013.01); *H01L 21/76838* (2013.01); *H01L 21/823821* (2013.01);
(Continued)

(58) Field of Classification Search
CPC ..... H01L 22/32; H01L 22/14; H01L 29/6609; H01L 29/66136; H01L 29/66204;
(Continued)

(56) References Cited

U.S. PATENT DOCUMENTS 4,896,108 A   1/1990  Lynch et al.
5,760,600 A   6/1998  Kasai
(Continued)

FOREIGN PATENT DOCUMENTS

JP          7-245401 A    9/1995

OTHER PUBLICATIONS

Stavitski, N. et al., "Specific Contact Resistance Measurements of Metal-Semiconductor Junctions" IEEE International Conference on Microelectronic Test Structures (2006) pp. 13-7.
(Continued)

*Primary Examiner* — Thanhha Pham
(74) *Attorney, Agent, or Firm* — Tutunjian & Bitetto, P.C.; Vazken Alexanian

(57) ABSTRACT

A test device includes a diode junction layer having a first dopant conductivity region and a second dopant conductivity region formed within the diode junction layer on opposite sides of a diode junction. A first portion of vertical transistors is formed over the first dopant conductivity region as a device under test, and a second portion of vertical transistors is formed over the second dopant conductivity region. A common source/drain region is formed over the first and second portions of vertical transistors. Current through the first portion of vertical transistors permits measurement of a resistance at a probe contact connected to the common source/drain region.

17 Claims, 6 Drawing Sheets

(51) Int. Cl.
  *H01L 21/768*  (2006.01)
  *H01L 21/8238* (2006.01)
  *H01L 21/84*   (2006.01)
  *H01L 29/778*  (2006.01)
  *H01L 29/786*  (2006.01)
  *H01L 29/78*   (2006.01)

(52) U.S. Cl.
  CPC .... *H01L 21/823885* (2013.01); *H01L 21/845* (2013.01); *H01L 22/32* (2013.01); *H01L 29/6609* (2013.01); *H01L 29/66136* (2013.01); *H01L 29/66204* (2013.01); *H01L 29/66666* (2013.01); *H01L 29/66712* (2013.01); *H01L 29/66795* (2013.01); *H01L 29/7788* (2013.01); *H01L 29/7802* (2013.01); *H01L 29/78642* (2013.01)

(58) Field of Classification Search
  CPC ......... H01L 29/66666; H01L 29/66712; H01L 29/66787; H01L 19/7788; H01L 2029/7858; H01L 29/78642; H01L 29/7802; H01L 29/7827; H01L 21/823885; H01L 21/8238
  See application file for complete search history.

(56) References Cited

U.S. PATENT DOCUMENTS

| | | |
|---|---|---|
| 7,391,226 B2 | 6/2008 | Michael et al. |
| 7,595,649 B2 | 9/2009 | Chetterjee et al. |
| 7,829,374 B2 | 11/2010 | Hayashi et al. |
| 7,859,291 B2 | 12/2010 | Kim |
| 8,759,881 B2 | 6/2014 | Bethoux et al. |
| 2008/0297180 A1 | 12/2008 | Vinet |
| 2011/0233512 A1* | 9/2011 | Yang ............... H01L 21/823487 257/9 |
| 2012/0242356 A1 | 9/2012 | Ohuchi et al. |

OTHER PUBLICATIONS

Crofton, J. et al., "Contact resistance measurements on p-type 6H-SiC" Applied Physics Letters (Jan. 1993) pp. 384-286, vol. 62, No. 4.

List of IBM Patents or Patent Applications Treated as Related dated Apr. 27, 2017, 2 pages.

* cited by examiner

TOP CONTACT RESISTANCE MEASUREMENT IN VERTICAL FETS

BACKGROUND

Technical Field

The present invention generally relates to semiconductor testing, and more particularly to devices and methods for contact resistance measurements in vertical transistor devices.

Description of the Related Art

Precisely measuring source/drain (S/D) contact resistance is a desirable for advancing complementary metal oxide semiconductor (CMOS) technology. Many traditional methods for measuring S/D contact resistance in planar CMOS devices cannot be employed for vertical field effect transistors (VFETs) due to drastic structural differences.

SUMMARY

In accordance with an embodiment of the present principles, a test device includes a diode junction layer having a first dopant conductivity region and a second dopant conductivity region formed within the diode junction layer on opposite sides of a diode junction. A first portion of vertical transistors is formed over the first dopant conductivity region as a device under test, and a second portion of vertical transistors is formed over the second dopant conductivity region. A common source/drain region is formed over the first and second portions of vertical transistors. Current through the first portion of vertical transistors permits measurement of a resistance at a probe contact connected to the common source/drain region.

Another test device includes a diode junction layer having a first dopant conductivity region and a second dopant conductivity region formed within the diode junction layer on opposite sides of a diode junction, the first dopant conductivity region including a vertical transistor drain for a device under test. A first portion of vertical transistors is formed over the first dopant conductivity region as the device under test, and a second portion of vertical transistors is formed over the second dopant conductivity region. The vertical transistors are formed vertically along semiconductor fins such that a device channel for the vertical transistors is disposed in a normal direction relative to the diode junction layer. A common source/drain region is formed over the first and second portions of vertical transistors. The common source/drain region includes a vertical transistor source for the device under test, wherein current through the first portion of vertical transistors permits measurement of a resistance at a probe contact connected to the common source/drain region.

A method for forming a test device includes forming a diode junction layer on a substrate, the diode junction layer having a first dopant conductivity region and a second dopant conductivity region formed within the diode junction layer on opposite sides of a diode junction; forming a first portion of vertical transistors over the first dopant conductivity region as a device under test and a second portion of vertical transistors over the second dopant conductivity region; and forming a common source/drain region over the first and second portions of vertical transistors such that current through the first portion of vertical transistors permits measurement of a resistance at a probe contact connected to the common source/drain region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
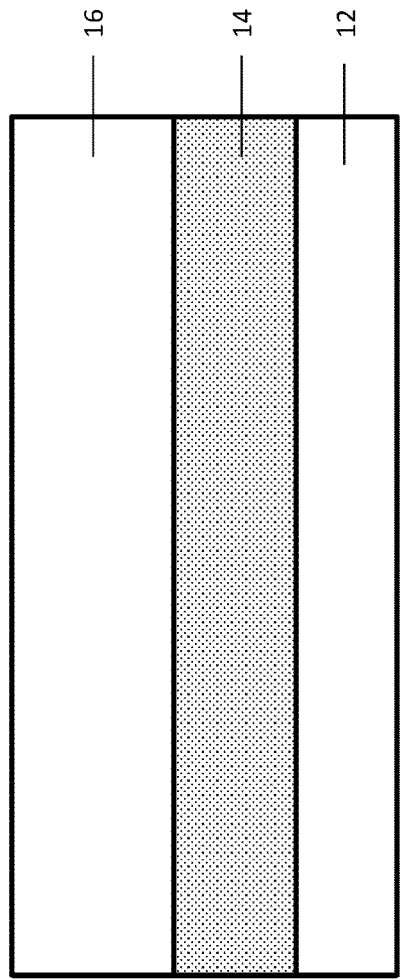
FIG. 1 is a cross-sectional view showing a substrate having a bottom source/drain layer and a channel layer formed thereon in accordance with the present principles.

In accordance with the present principles, structures and methods for fabricating the structures are provided for building a testing device. In useful embodiments, the testing device includes fins with vertical field effect transistors (VFETs) formed along with a structure to measure contact resistance. The testing device may be formed on each chip or may be formed on one or more chips of a wafer to provide data for all chips on the wafer.

The testing setup provides a reverse biased diode junction below vertical transistors of a device under test (DUT) and a test structure. One side of the junction is below the vertical transistors of the DUT, and the other side of the junction is below the vertical transistors of the test structure. A doped region having a same dopant conductivity as the junction below the DUT is formed over the vertical transistors for the DUT and the test structure. Equal potential is provided at a probe point on the DUT and on a source region of the test structure to ensure greater test measurement accuracy.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, the formation of a test device 10 may begin with a substrate 12. The substrate 12 and its processing, as described herein, will illustratively be for N-type field effect transistor (NFET) devices. The NFET device will employ N-type dopants in P-wells. It should be understood that the present principles may also apply to P-type field effect transistor (PFET) devices by employing P-type dopants and N-wells.

The substrate 12 includes a semiconductor material, such as, e.g., Si, SiGe, SiC, Ge, III-V materials, etc. The substrate 12 includes a P-type substrate, preferably Si, in this embodiment. A source/drain (S/D) layer 14 is grown on the substrate 12. The S/D layer 14 is a highly doped N-type layer (N+). The S/D layer 14 may be epitaxially grown on the substrate 12 and may be doped in-situ.

S/D epitaxy of layer 14 can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, N-type dopants (e.g., phosphorus or arsenic) or P-type dopants (e.g., boron or gallium), depending on the type of transistor. The dopant concentration in the source/drain layer 14 can range from about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

A channel layer 16 is formed on the S/D layer 14. The channel layer 16 may be formed by an epitaxial deposition process as described above. The channel layer 16 may be doped in-situ and have a lower dopant concentration than the S/D layer 14. The material of the channel layer 16 may be the same as the S/D layer 14. The channel layer 16 will be formed into fins.

Figure 2:
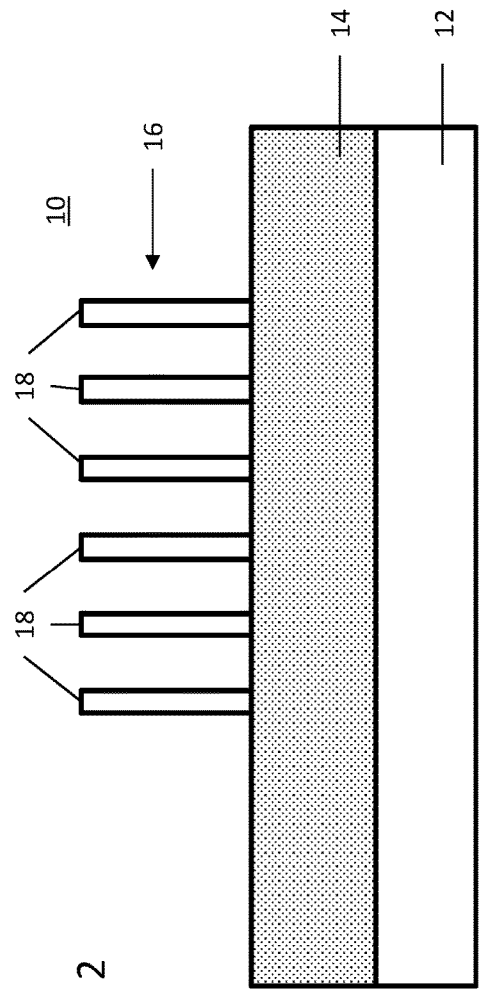
FIG. 2 is a cross-sectional view showing the channel layer of FIG. 1 patterned to form fins in accordance with the present principles.

Referring to FIG. 2, fins 18 may be formed by patterning a mask and etching. The etch mask may include resist or other materials, and the patterning may include lithography, spacer image transfer (SIT) or other techniques. The fins 18 are etched in accordance with the etch mask to form appropriate dimensions (e.g., height, width). The etching includes a reactive ion etch (RIE) or other directional etch process. The etch stops on the S/D layer 14. Note six fins 18 are depicted in FIG. 2; however, it should be understood that other numbers of fins may be employed.

Figure 3:
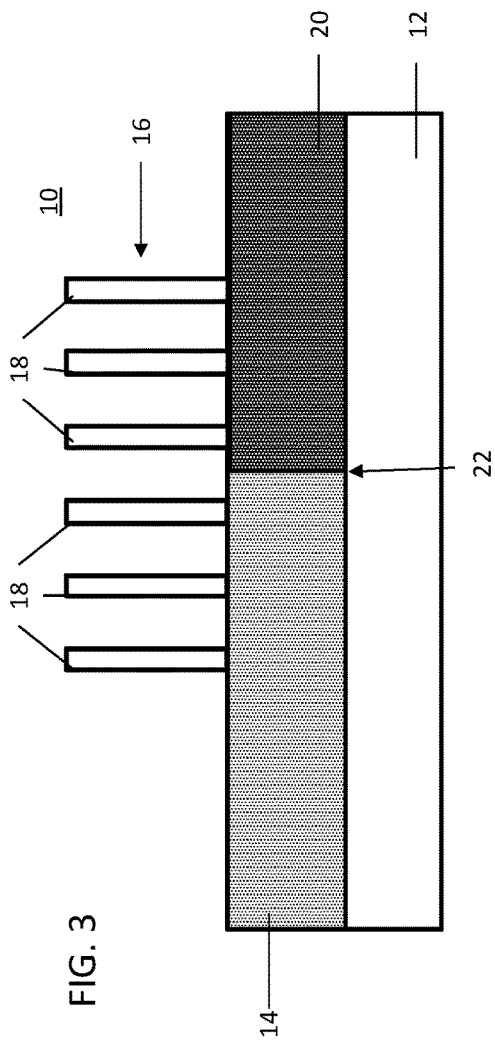
FIG. 3 is a cross-sectional view showing a structure of FIG. 2 where a portion of the source/drain layer is implanted with dopants of an opposite conductivity in accordance with the present principles.

Referring to FIG. 3, a block mask (not shown) is formed over some (one half) of the fins 18, and the remaining fins 18 and unblocked portion of the S/D layer 14 are exposed to an ion implantation process. The ion implantation process includes P-type dopant implantation to render a region 20 a P-type region. The P-type dopants may include boron, gallium, etc. The ion implantation forms an N-P junction 22. Note that not every device on a wafer needs to have a test device 10 formed thereon nor does each device on a chip need a test device 10.

Figure 4:
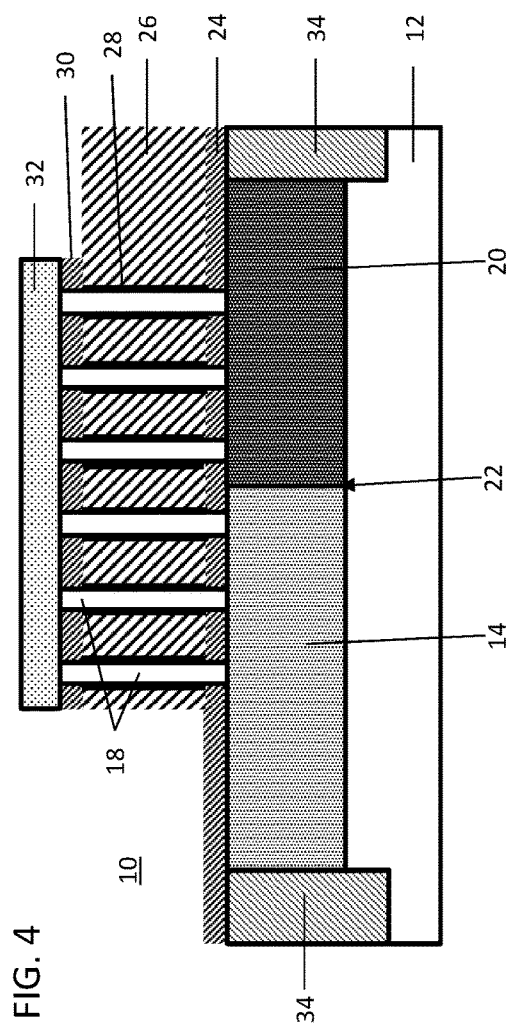
FIG. 4 is a cross-sectional view showing the structure of FIG. 3 where shallow trench isolation regions, vertical transistors, a gate structure and a common source/drain region are formed in accordance with the present principles.

Referring to FIG. 4, shallow trenches are formed through the S/D layer 14 (and region 20) and into the substrate 12. The shallow trenches may be patterned using lithography or other patterning techniques and etched with RIE. The shallow trenches are filled with a dielectric material and planarized, e.g., with a chemical mechanical polish (CMP) or etch to form shallow trench isolation region 34.

A bottom spacer 24 is formed at a base of the fins 18. The bottom spacer 24 may include a nitride material although other suitable materials may be employed. The bottom spacer 24 may be selectively deposited on horizontal surfaces.

A gate dielectric 28 is formed on sidewalls of the fins 18. The gate dielectric 28 may include a grown oxide, a high-k material, a dielectric material or combinations thereof. In various embodiments, the high-k material of gate dielectric 28 may include $HfO_2$, $HfSiO_4$, $HfSiON$, $La_2O_3$, $Ta_2O_5$, $ZrO_2$, and/or $SrTiO_3$, or combinations thereof.

A gate conductor 26 is formed between the fins 18 on the gate dielectric 28. The gate conductor 26 includes conductive materials, such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. In useful embodiments, the gate conductor 26 may include TiN, HfN, TaN, TiC, TaC, HfC, WC, TiAlN, W, etc. or combinations thereof. The gate conductor 26 may include multiple layers including, a work function layer, a main conductor, diffusion barriers, etc.

The gate conductor 26 and the gate dielectric 28 are recessed below a top of the fins 18. A top spacer layer 30 is formed over the tops of the fins 18 and then the fins are exposed by a CMP or etch process. The top spacer layer 30 may include a nitride material although other suitable materials may be employed.

A top S/D region 32 is grown on the exposed tops of the fins 18 and over the top spacer layer 30. The top S/D region 32 may include Si and is preferably doped in-situ. In this embodiment, the top S/D region 32 includes a highly doped N-type region (N+). Each fin 18 now forms a vertical field effect transistor (VFET) with S/D regions 14 or 20 and 32. A gate structure including the gate dielectric 28 and the gate conductor 26 are disposed between the S/D regions 14 or 20 and 32. In the embodiment shown, three fins 18 are formed over the S/D layer 14, and three fins are formed over the S/D region 20 with the diode junction 22 formed therebetween.

Figure 5:
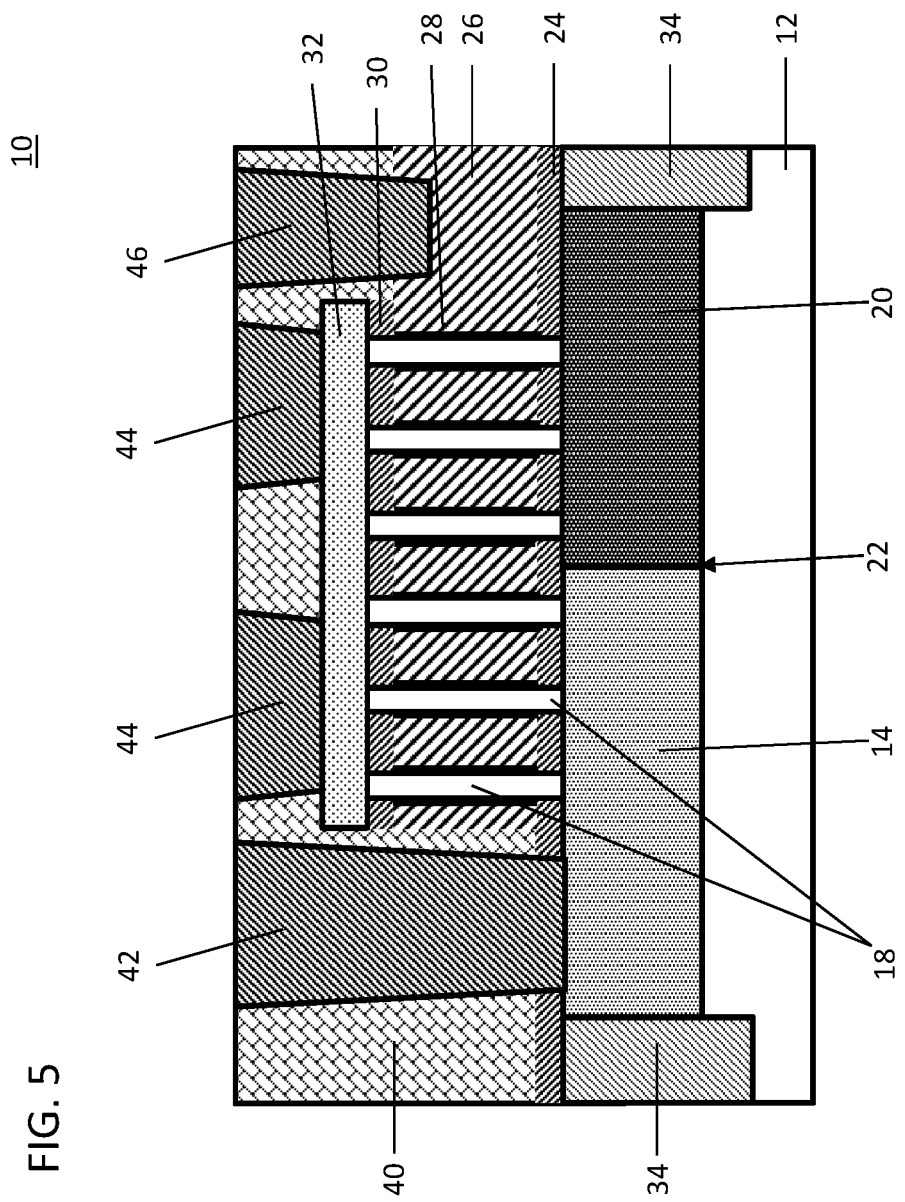
FIG. 5 is a cross-sectional view showing the structure of FIG. 4 where contacts are formed through an interlevel dielectric layer in accordance with the present principles.

Referring to FIG. 5, an interlevel dielectric (ILD) 40 is formed over the S/D region 32 and the bottom spacer layer 24. The ILD 40 may include any suitable dielectric materials, e.g., a silicon oxide, nitride, etc. The ILD 40 is patterned to form openings for forming contacts 42, 44 and 46. A contact 42 corresponds with the S/D region layer 14. Contacts 44 land on the S/D region 32. One contact 44 is over the S/D region layer 14 portion and the other contact 44 is over the P-type region 20. A contact 46 connects to the gate conductor 26. The openings for the contacts 42, 44 and 46 are formed by an etch process, e.g., a reactive ion etch (RIE) in accordance with a lithographic pattern. The RIE removes the ILD 40 (and bottom spacer layer 24, where applicable) down to the epitaxy regions 14, 32 and gate conductor 26.

Contacts 42, 44 and 46 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

After the contact fill, a planarization process, such as a chemical mechanical polish (CMP) may be performed. The planarization process completes the contacts 42, 44 and 46. Further processing may include forming additional metal lines and connections.

Figure 6:
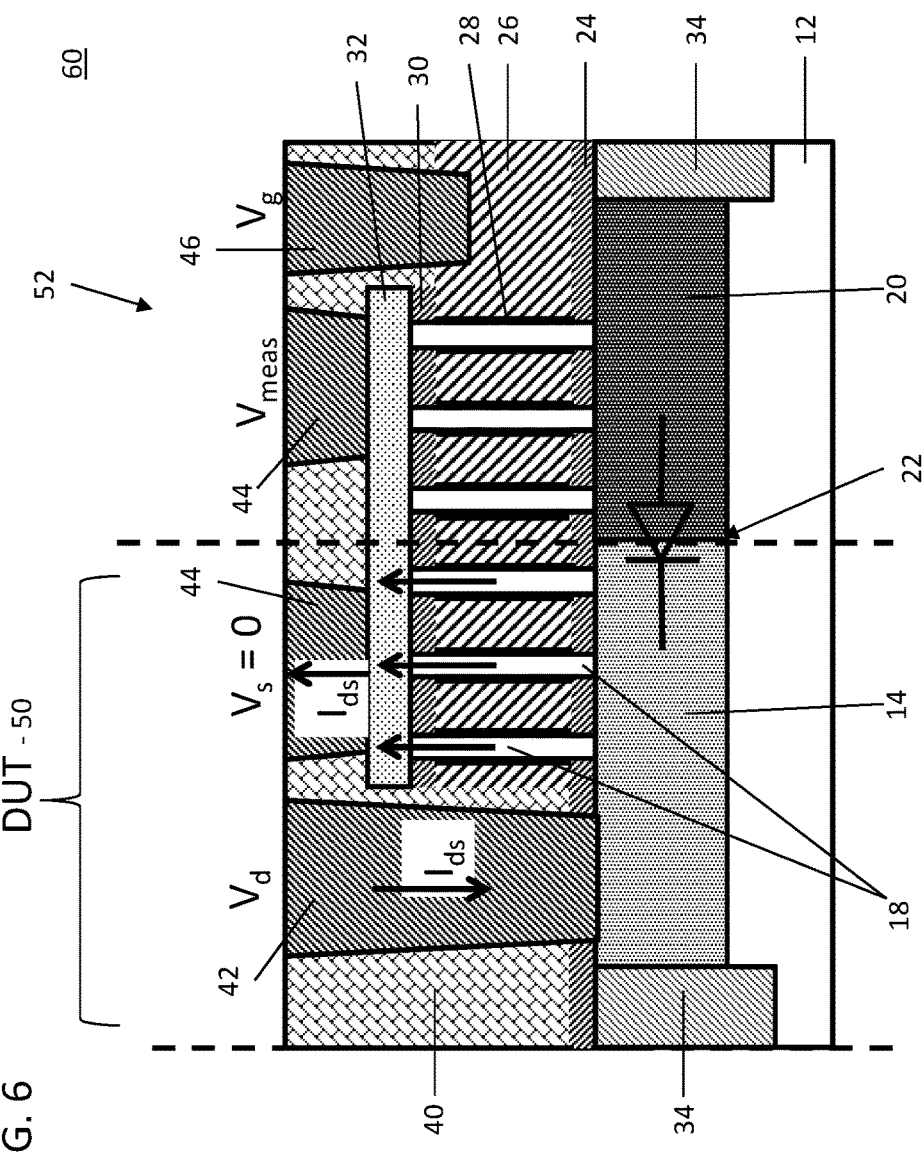
FIG. 6 is a cross-sectional view showing a test device where sense potential is measured by holding a source voltage to zero with fins in a first orientation in accordance with the present principles.

Referring to FIG. 6, a test setup 60 is shown in accordance with one illustrative embodiment. S/D region 14 includes a drain for vertical transistors with fins 18 as channels for the DUT 50. Region 32 acts as a source for the DUT 50. A test structure 52 includes a portion of S/D region 32, the P-type region 20 and fins 18 as channels for vertical transistors in the test setup region 52 (e.g., the three right hand side vertical transistors in FIG. 6). During a test procedure, a source voltage (Vs) of DUT 50 is biased to zero, e.g., Vs=0. A gate voltage (Vg) on gate conductor 26 and contact 46 is biased to turn on the DUT 50 and force current through the source and drain of DUT 50, e.g., $I_{ds}$.

Due to a reverse biased bottom junction 22, no current can flow in the fins 18 in the test setup side 52 (e.g., the three right side fins 18 in FIG. 6). In this way, no lateral current flows inside the S/D region 32 over the fins 18 on the test setup side 52 (e.g., the three right side fins 18 in FIG. 6). Therefore, the potential across the S/D region 32 is equal. For example, the S/D region 32 has equal potential across the test setup side 52 and the DUT 50.

$V_{meas}$ is a sense potential measurement of the S/D region 32. $V_{meas}$ is measured at a probe contact 44 in the test structure 52. The contact resistance ($R_c$) can be calculated as $R_c = V_{meas}/I_{ds}$ (where $I_{ds}$ is the drain-source current). If there were no P-type region 20 at the bottom, current would flow laterally from right to left inside the top S/D region 32, leading to a potential difference between the DUT 50 portion of the S/D region 32 and the S/D region 32 in the test setup side 52. This would lead to erroneous measurement results. Instead, with the uniform potential, an accurate measurement can be made for contact resistance using $V_{meas}$ and $I_{ds}$.

Figure 7:
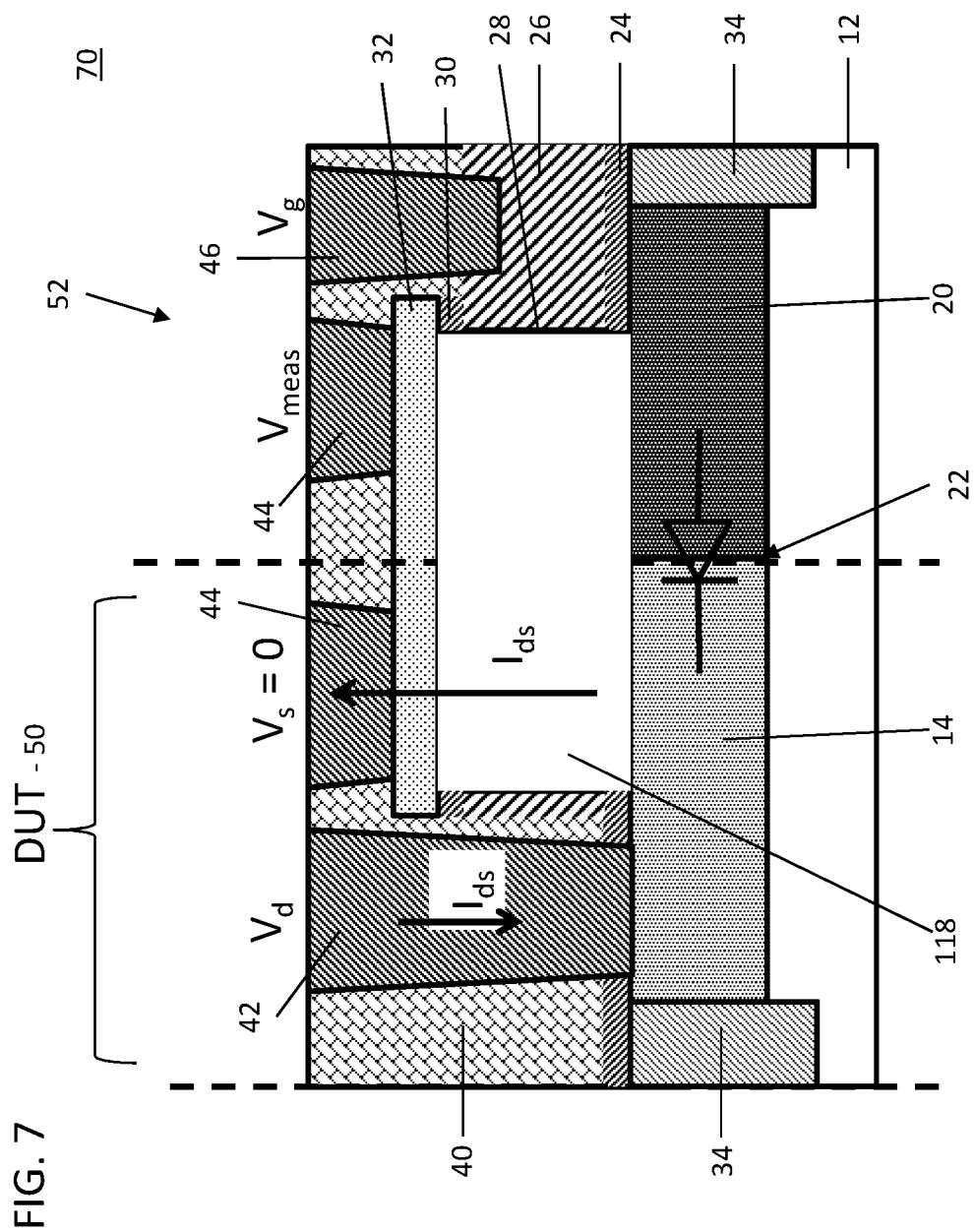
FIG. 7 is a cross-sectional view showing a test device where sense potential is measured by holding a source voltage to zero with fins in a second orientation in accordance with the present principles.

Referring to FIG. 7, a test setup 70 is shown in accordance with another illustrative embodiment. S/D region 14 includes a drain for vertical transistors with a fin(s) 118 as a channel(s) for the DUT 50. Region 32 acts as a source for the DUT 50. A test structure 52 includes a portion of S/D region 32, the P-type region 20 and a portion of fin 118 for vertical transistors in the test setup region 52.

Here, the fin 118 extends between the DUT 50 and the test structure 52. In one embodiment, the fin 118 is half in DUT 50 region over S/D layer 14 and half in the test structure 52 and over P-type region 20.

As before, during a test procedure, a source voltage (Vs) of DUT 50 is biased to zero, e.g., Vs=0. A gate voltage (Vg) on gate conductor 26 and contact 46 is biased to turn on the DUT 50 and force current through the source and drain of DUT 50, e.g., $I_{ds}$.

Due to a reverse biased bottom junction 22, no current can flow in the fins 118 in the test setup side 52. In this way, no current flows inside the S/D region 32 along the fin 118 on the test setup side 52. Therefore, the potential across the S/D region 32 is equal. For example, the S/D region 32 has equal potential across the test set up side 52 and the DUT 50.

$V_{meas}$ is a potential of the S/D region 32. The contact resistance ($R_c$) can be calculated as $R_c = V_{meas}/I_{ds}$ (where $I_{ds}$ is the drain-source current). With the uniform potential an accurate measurement can be made for contact resistance using $V_{meas}$ and $I_{ds}$.

Figure 8:
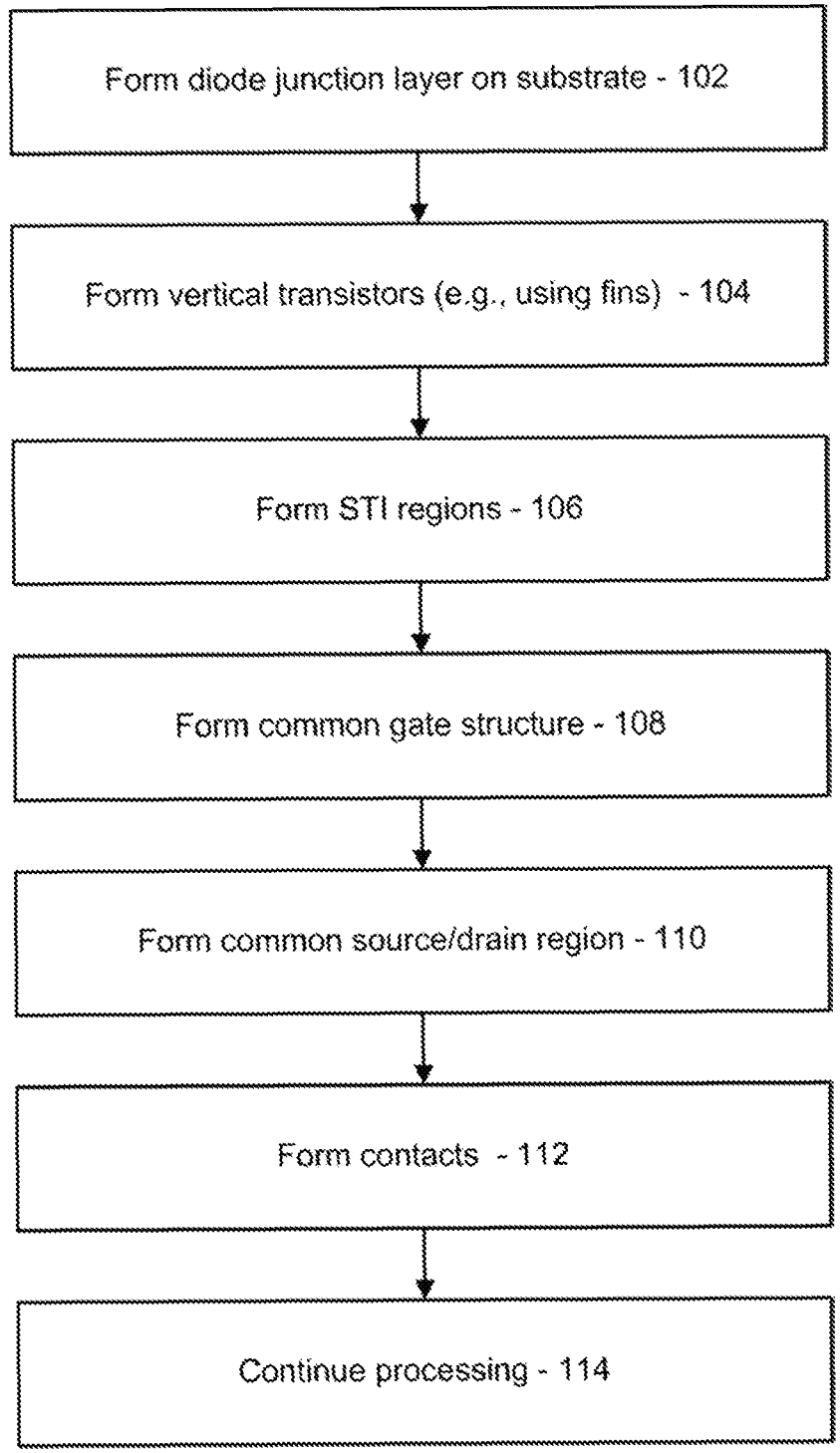
FIG. 8 is a flow diagram showing methods for forming a test device in accordance with the present principles.

Referring to FIG. 8, methods for forming a test device are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a diode junction layer is formed on a substrate. The diode junction layer has a first dopant conductivity region and a second dopant conductivity region formed within the diode junction layer on opposite sides of a diode junction. In block 104, a first portion of vertical transistors is formed over the first dopant conductivity region as a device under test (DUT), and a second portion of vertical transistors is formed over the second dopant conductivity region. The vertical transistors may be formed in a number of different ways having different structures for the DUT.

The vertical transistors may be formed vertically along semiconductor fins such that a device channel for the vertical transistors is disposed in a normal direction relative to the diode junction layer. The first portion of vertical transistors may include whole fins, or the first portion of vertical transistors may include a part of fins that extends into a device under test region and a part that extends into a test setup region outside the device under test region.

In block 106, shallow trench isolation (STI) regions may be formed down to the substrate. In block 108, a common gate structure may be formed that serves both the first and second portions of vertical transistors.

In block 110, a common source/drain region is formed over the first and second portions of vertical transistors such that current through the first portion of vertical transistors permits measurement (e.g., of a resistance) at a probe contact connected to the common source/drain region. The common source/drain region is common to the DUT and the test setup. During use, the diode junction actively prevents lateral current flow in the common source/drain region when a source voltage of the DUT is maintained at substantially zero to measure the sense potential.

In block 112, contacts are formed through an ILD. The contacts include a probe contact from which voltage measurements can be made (sense potential). In block 114, processing continues to complete the device. The testing device may be formed on each chip or may be formed on one or more chips of a wafer to provide data for all chips on the wafer.

Having described preferred embodiments for top contact resistance measurement in vertical FETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a test device, comprising:
   forming a diode junction layer on a substrate, the diode junction layer having a first dopant conductivity region and a second dopant conductivity region formed within the diode junction layer on opposite sides of a diode junction;
   forming a first portion of vertical transistors over the first dopant conductivity region as a device under test and a second portion of vertical transistors over the second dopant conductivity region; and
   forming a common source/drain region over the first and second portions of vertical transistors such that current through the first portion of vertical transistors permits measurement of a resistance at a probe contact connected to the common source/drain region.

2. The method as recited in claim 1, wherein forming the first portion of vertical transistors includes forming the vertical transistors vertically along semiconductor fins such that a device channel for the vertical transistors is disposed in a normal direction relative to the diode junction layer.

3. The method as recited in claim 2, wherein the first portion of vertical transistors includes whole fins.

4. The method as recited in claim 2, wherein the first portion of vertical transistors includes part of fins that extends into a device under test region and part that extends into a test setup region outside the device under test region.

5. The method as recited in claim 1, further comprising forming a common gate structure that serves both the first and second portions of vertical transistors.

6. The method as recited in claim 1, wherein the diode junction actively prevents lateral current flow in the common source/drain region when a source voltage of the device under test is maintained at substantially zero to measure the sense potential.

7. The method as recited in claim 1, further comprising measuring current through the first portion of vertical transistors to measure a resistance at the probe contact connected to the common source/drain region.

8. The method as recited in claim 1, further comprising forming contacts to the common source/drain region in the first portion and in the second portion including the probe contact.

9. The method as recited in claim 8, further comprising measuring contact resistance through the probe contact.

10. A method for forming a test device, comprising:
    forming a diode junction layer on a substrate, the diode junction layer having a first dopant conductivity region and a second dopant conductivity region formed within the diode junction layer on opposite sides of a diode junction;
    forming a first portion of vertical transistors over the first dopant conductivity region as a device under test and a second portion of vertical transistors over the second dopant conductivity region; and
    forming a common source/drain region over the first and second portions of vertical transistors; and
    forming contacts to the common source/drain region in the first portion and in the second portion such that current through the first portion of vertical transistors permits measurement of a resistance at a probe contact connected to the common source/drain region.

11. The method as recited in claim 10, wherein forming the first portion of vertical transistors includes forming the vertical transistors vertically along semiconductor fins such that a device channel for the vertical transistors is disposed in a normal direction relative to the diode junction layer.

12. The method as recited in claim 11, wherein the first portion of vertical transistors includes whole fins.

13. The method as recited in claim 11, wherein the first portion of vertical transistors includes part of fins that extends into a device under test region and part that extends into a test setup region outside the device under test region.

14. The method as recited in claim 10, further comprising forming a common gate structure that serves both the first and second portions of vertical transistors.

15. The method as recited in claim 10, wherein the diode junction actively prevents lateral current flow in the common source/drain region when a source voltage of the device under test is maintained at substantially zero to measure the sense potential.

16. The method as recited in claim 10, further comprising measuring current through the first portion of vertical transistors to measure a resistance at the probe contact connected to the common source/drain region.

17. The method as recited in claim 10, further comprising measuring contact resistance through the contacts.

* * * * *